(12) United States Patent
Lin et al.

(10) Patent No.: US 7,800,111 B2
(45) Date of Patent: Sep. 21, 2010

(54) TRENCH SILICON-ON-INSULATOR (SOI) DRAM CELL

(75) Inventors: Jyi-Tsong Lin, Kaohsiung (TW); Kuo-Dong Huang, Kaohsiung (TW); Kao-Cheng Lin, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 104 days.

(21) Appl. No.: 12/255,780

(22) Filed: Oct. 22, 2008

(65) Prior Publication Data
US 2009/0101958 A1  Apr. 23, 2009

(30) Foreign Application Priority Data
Oct. 23, 2007  (TW) ............................... 96139594 A

(51) Int. Cl.
*H01L 27/108* (2006.01)
(52) U.S. Cl. ................. 257/68; 257/296; 257/E27.084; 257/E21.646
(58) Field of Classification Search ............... 257/68, 257/71, 296, 300, 301, 303, E21.646, E27.084, 257/E27.112
See application file for complete search history.

(56) References Cited

U.S. PATENT DOCUMENTS
6,426,252 B1 *  7/2002  Radens et al. ............... 438/243

FOREIGN PATENT DOCUMENTS
| TW | 465015 | 1/1986 |
| TW | I267979 | 5/1993 |
| TW | I270179 | 7/1994 |

* cited by examiner

*Primary Examiner*—Sue Purvis
*Assistant Examiner*—Selim Ahmed
(74) *Attorney, Agent, or Firm*—Volentine & Whitt, PLLC

(57) ABSTRACT

The present invention relates to a trench silicon-on-insulator (SOI) dynamic random access memory (DRAM) cell and a method for making the same. A source and a drain are utilized to each connect to one of two semiconductor conductive units on an external side of a main body having a plurality of semiconductor conductive units, and the semiconductor conductive units are utilized to accumulate electric charges generated from the drain so as to decrease a threshold voltage. In addition, the DRAM cell only uses one field effect transistor (FET) device (1T), has characteristics of the conventional 1T-DRAM, and has higher integration density. Moreover, the process of the invention is simple, so the production cost can be reduced.

18 Claims, 15 Drawing Sheets

TRENCH SILICON-ON-INSULATOR (SOI) DRAM CELL

BACKGROUND OF THE INVENTION

1. Field of the Invention

The present invention relates to a dynamic random access memory (DRAM) cell and a method for making the same, and more particularly to a trench silicon-on-insulator (SOI) DRAM cell and a method for making the same.

2. Description of the Related Art

Semiconductor technology is developing towards devices and systems with small volume, low power consumption, low leakage current, and high operating speed. As for a semiconductor memory, a conventional DRAM is a memory cell composed of a transistor and a capacitor. As the demand for a larger memory capacity increases, people attach more importance to the integration density of the memory. Although transistors have been miniaturized to allow mass production under 65 nm in recent years, in a conventional bulk metal-oxide semiconductor (MOS) structure, the integration density of the DRAM cell is limited by the capacitor size, and cannot be increased significantly.

Recently, many DRAM cell techniques concerning stack capacitors (referring to ROC Patent No. 465015) and trench capacitors (referring to U.S. Pat. No. 6,426,252 B1 and ROC Patent No. 1270179) have been proposed. In these techniques, though a capacitor board area is increased in a limited space, it is still quite complicated to make an electrode and a dielectric layer with high quality in a structure with a large depth-to-width ratio. Therefore, effectively reducing the area occupied by the capacitor in the DRAM is a problem that needs to be solved in the industry, and the most direct and most common solution is to fabricate the transistor on a trench capacitor.

However, as the transistor size is reduced, during the performance of the memory, parasitic capacitance and short channel effect problems may occur, which are as important as the integration density of the memory. Therefore, research in which a bulk MOS device is replaced by an SOI is proposed (referring to ROC patent No. 1267979). The SOI device applied to the DRAM has the following advantages. 1. The device has a relatively smaller drain-body and source-body parasitic capacitance, so as to increase the charging and discharging speeds. 2. The device has better short channel effect immunity. 3. The device may effectively prevent the DRAM from being damaged by radiation which would generate soft errors.

Currently, the research on the SOI-DRAM is moving towards a capacitor-less memory. For example, for a partially depleted SOI (PDSOI)-DRAM, the capacitor function is replaced by the electric charge in a pseudo neutral region of the device body based on a floating body effect, that is, a 1T-DRAM structure is used to most effectively solve the problem that the conventional 1T-1C-DRAM occupies too much area.

However, the pseudo neutral region is affected by doping concentration, source/drain junction depth, and body thickness, so the stored electric charge may not be large enough to be sensed by a circuit of a sensing amplifier, which is the most difficult problem of the 1T-DRAM. Currently, it is considered that the stored electric charge may be increased by using a back gate or by increasing the body thickness. However, the back gate structure undoubtedly increases the complexity and the reliability of the device, and the greater body thickness relatively increases the parasitic capacitance, which lowers the charging and discharging speeds of the memory.

In addition, in the SOI-DRAM provided in ROC Patent No. 1267979, the trench structure is still a capacitor board structure with a high depth-to-width ratio and a high complexity.

Therefore, it is necessary to provide a trench SOI-DRAM cell and a method for making the same, so as to solve the above problems.

SUMMARY OF THE INVENTION

The present invention is directed to a trench SOI-DRAM cell. The DRAM cell includes a substrate, an oxide layer, a semiconductor conductive layer, a gate group, a spacer, an oxide protective layer, and an electrode group. The oxide layer covers the substrate, and has a plurality of trenches that extend approximately towards a first direction. The semiconductor conductive layer covers the oxide layer and the trenches, has a main body, a source, and a drain, in which the main body covers the trenches to form a plurality of semiconductor conductive units, the source and the drain are formed on two different sides of the main body, and surfaces of the two sides are approximately parallel to the first direction. The gate group has a gate dielectric layer and a gate that cover the main body and the gate dielectric layer respectively. The spacer covers two opposite lateral sides of the gate group those are approximately parallel to the first direction. The oxide protective layer covers the source, the drain, the spacer, and the gate, and has a first through hole, a second through hole, and a third through hole that are respectively formed at positions above and corresponding to the gate, the source, and the drain, so as to expose a part of the gate, a part of the source, and a part of the drain. The electrode group has a first electrode, a second electrode, and a third electrode, respectively disposed in the first through hole, the second through hole, and the third through hole, and respectively electrically connected to the gate, the source, and the drain.

The present invention is further directed to a method for making a trench SOI-DRAM cell which includes the following steps: (a) providing a substrate; (b) forming an oxide layer that covers the substrate, and has a plurality of trenches that extend approximately towards a first direction; (c) forming a semiconductor conductive layer that covers the oxide layer and the trenches, and has a first part, a second part, and a third part; the first part covers the trenches, the second part and the third part are formed on two different sides of the first part, and surfaces of the two sides are approximately parallel to the first direction; (d) performing a first ion implantation step on the semiconductor conductive layer; (e) forming a gate group that has a gate dielectric layer and a gate, and the gate dielectric layer covers the first part, and the gate covers the gate dielectric layer; (f) forming a spacer that covers two opposite lateral sides of the gate group that are approximately parallel to the first direction; (g) performing a second ion implantation step, so as to form a main body, a source, and a drain corresponding to the first part, the second part, and the third part of the semiconductor conductive layer; (h) forming an oxide protective layer that covers the source, the drain, the spacer, and the gate, and has a first through hole, a second through hole, and a third through hole that are respectively formed at positions above and corresponding to the gate, the source, and the drain, so as to expose a part of the gate, a part of the source, and a part of the drain; and (i) forming an electrode group that has a first electrode, a second electrode, and a third electrode respectively disposed in the first through hole, the second through hole, and the third through hole, and respectively electrically connected to the gate, the source, and the drain.

In the present invention, the source and the drain are each connected to one of the two semiconductor conductive units on an external side of the main body, and the plurality of other semiconductor conductive units exists between the two semiconductor conductive units on the external side of the main body. Therefore, the semiconductor conductive units may directly accumulate electric charges generated from the drain, and a potential generated by the accumulated electric charges may reduce a threshold voltage of the DRAM cell of the present invention.

In addition, the DRAM cell of the present invention only uses one field effect transistor (FET) device (1T), has the conventional 1T-DRAM characteristics, and has an integration density higher than that of the conventional memory. Moreover, the process for making the DRAM cell of the present invention is simple, so that the production cost can be greatly reduced.

DETAILED DESCRIPTION OF THE INVENTION

Figure 1:
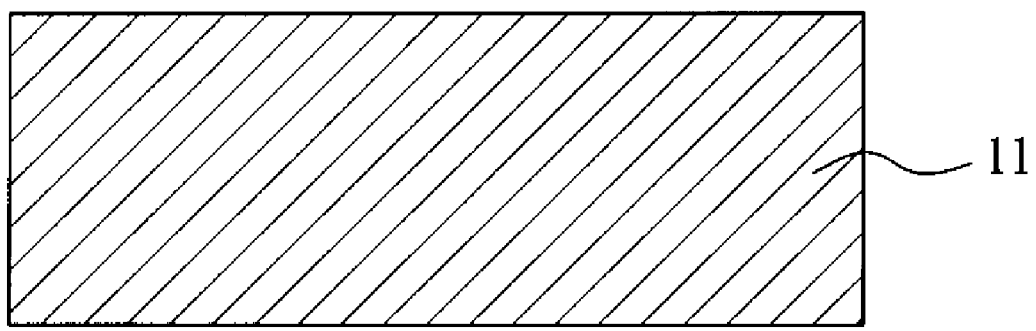
FIG. 1 is a schematic view of a substrate according to the present invention.
Figure 2:
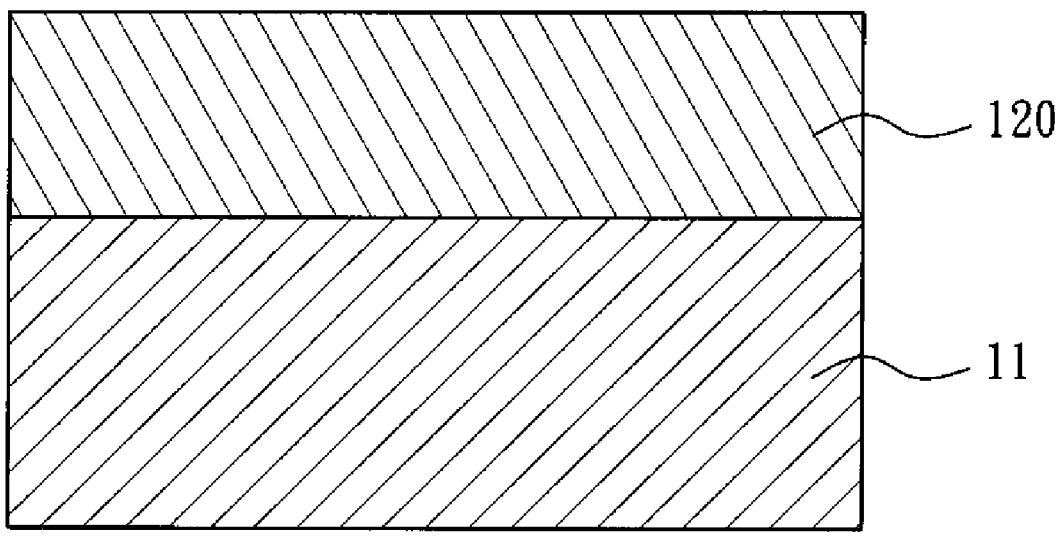
FIG. 2 is a schematic view of forming an oxide on the substrate according to the present invention.
Figure 3:
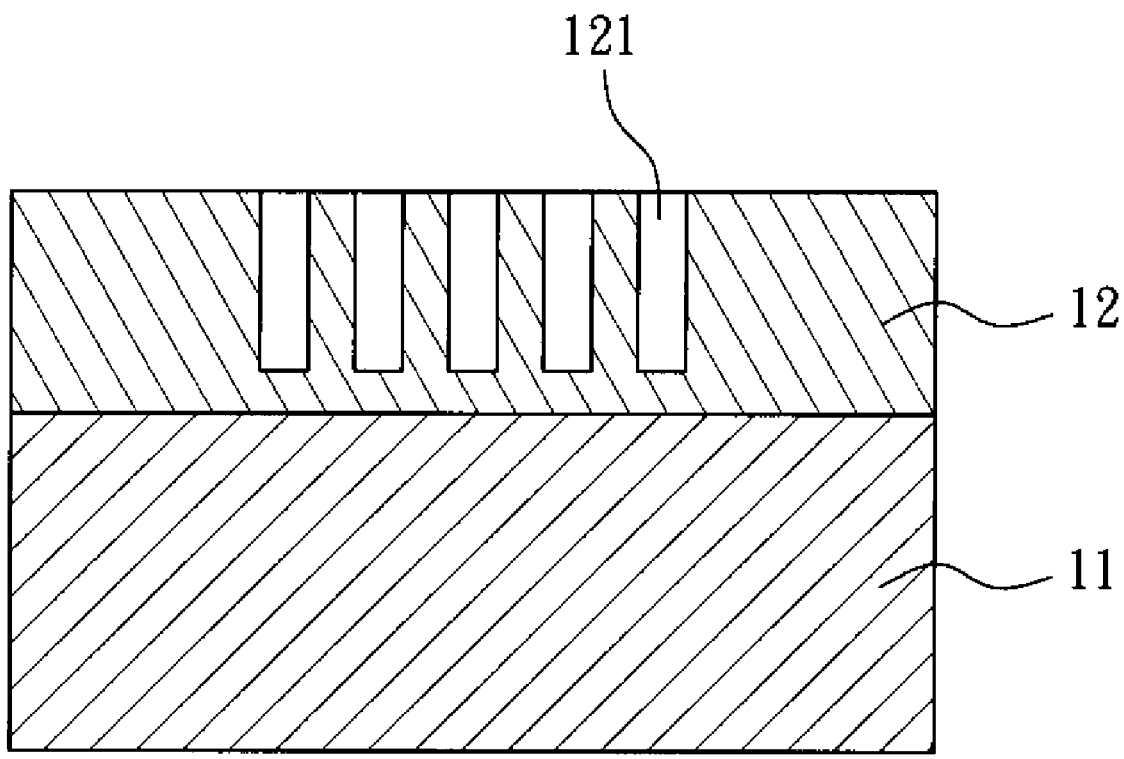
FIG. 3 is a schematic view of forming an oxide layer according to the present invention.

FIGS. 1 to 15 show a method for making a trench SOI-DRAM cell according to the present invention. Referring to FIG. 1, firstly, a substrate 11 is provided. Referring to FIGS. 2 and 3, an oxide 120 is formed completely to cover the substrate 11. Next, a part of the oxide 120 is removed to form an oxide layer 12 that has a plurality of trenches 121. In this embodiment, the oxide 120 is formed by using a low-pressure chemical vapor deposition (LPCVD) method or a wet oxidization method, and the trenches 121 are formed by using an optical lithography technique or an e-beam direct writing technique.

Figure 4:
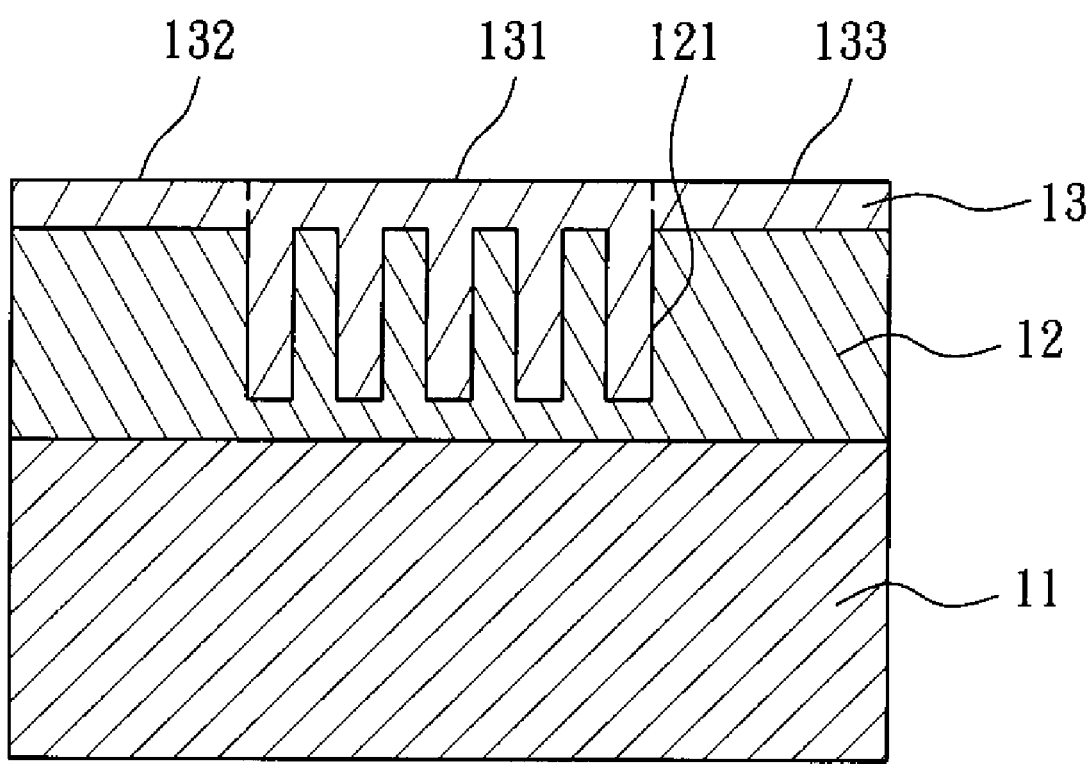
FIG. 4 is a schematic view of forming a semiconductor conductive layer according to the present invention.

Referring to FIG. 4, a semiconductor conductive layer 13 is formed. The semiconductor conductive layer 13 covers the oxide layer 12 and the trenches 121, and has a first part 131, a second part 132, and a third part 133. The first part 131 covers the trenches 121, the second part 132 and the third part 133 are formed on two different sides of the first part 131, and surfaces of the two sides are approximately parallel to a first direction (in this embodiment, the first direction is perpendicular to a paper surface). In this embodiment, the semiconductor conductive layer 13 is formed by using the LPCVD method. Preferably, in the present invention, a solid-phase recrystallization (SPC) growth is performed by using a high temperature tempering method or a recrystallization is performed by using an excimer laser annealing (ELA) method, so as to improve the quality and to reduce the defects in the semiconductor conductive layer 13.

It should be noted that in the present invention, the thicker semiconductor conductive layer 13 is formed first, and next, the semiconductor conductive layer 13 is planarized by using a planarizing technique (for example, a chemical mechanical polishing (CMP) process), and then the SPC growth or the ELA is performed. Alternatively, in the present invention, the thicker semiconductor conductive layer 13 is formed first, and next, the SPC growth or the ELA is performed, and then the semiconductor conductive layer 13 is planarized by using the planarizing technique.

Figure 5:
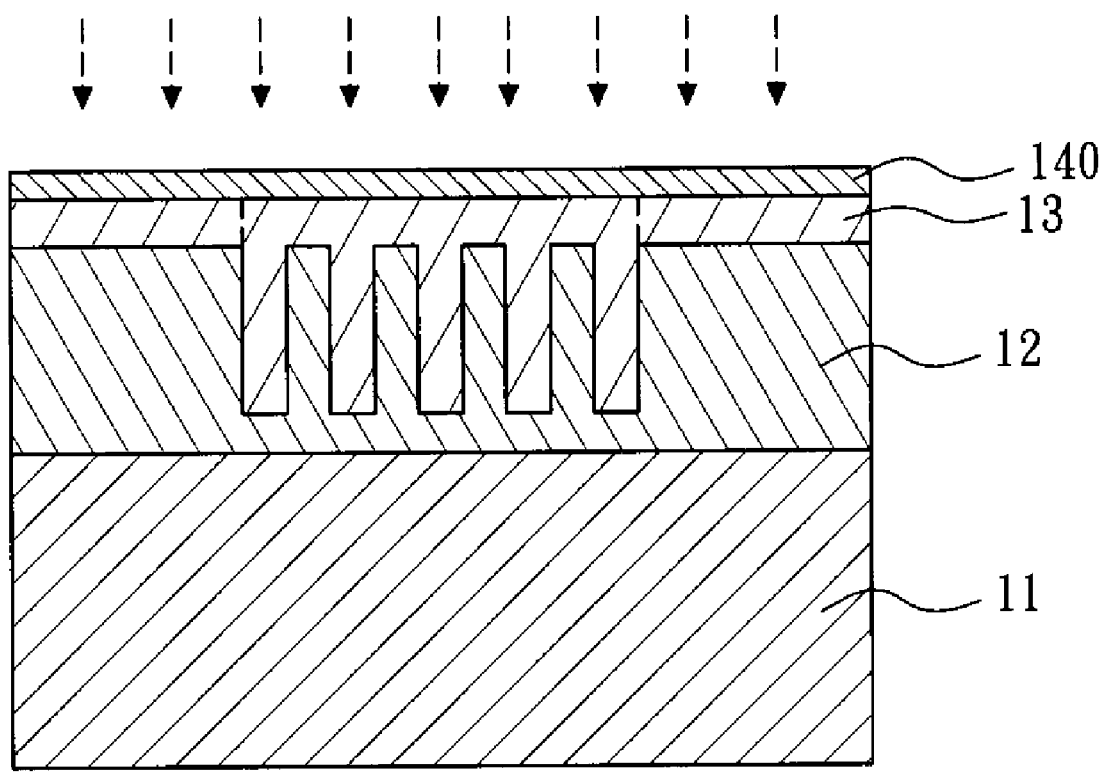
FIG. 5 is a schematic view of forming a first scattering layer according to the present invention.
Figure 6:
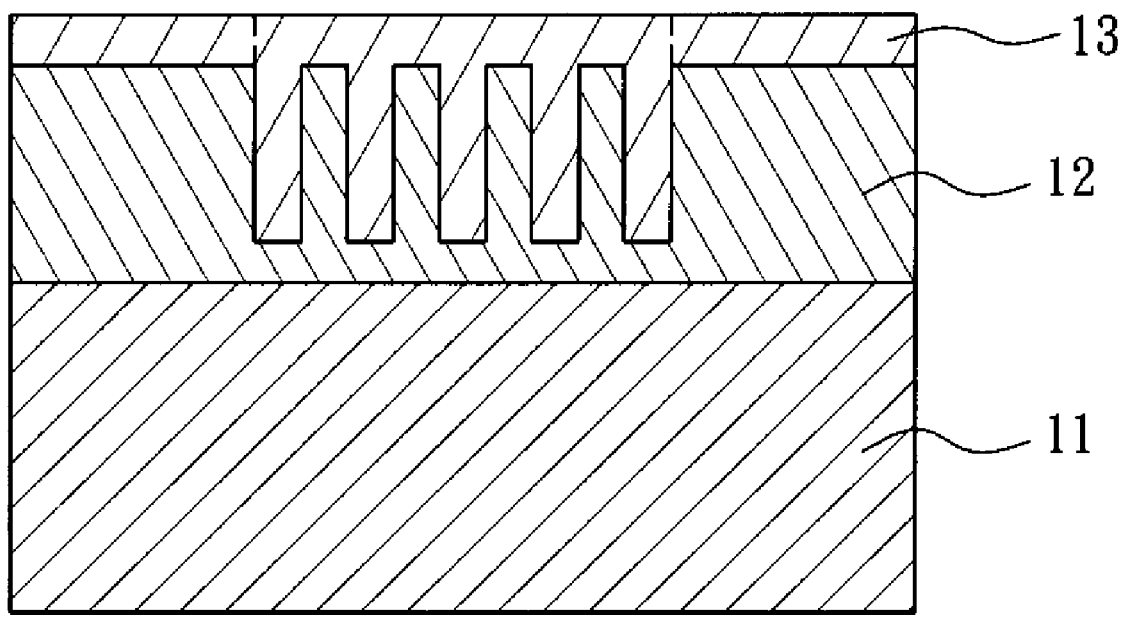
FIG. 6 is a schematic view of performing an ion implantation on the semiconductor conductive layer according to the present invention.

Referring to FIGS. 5 and 6, a first ion implantation step is performed, so as to perform an ion implantation on the semiconductor conductive layer 13. Firstly, a first scattering layer 140 is formed, so as to cover the semiconductor conductive layer 13. Next, the first ion implantation step is performed, so as to perform the ion implantation on the semiconductor conductive layer 13. If a doped carrier is phosphor (P) or arsenic (As), the semiconductor conductive layer 13 is an N-type semiconductor. If the doped carrier is boron (B), the semiconductor conductive layer 13 is a P-type semiconductor. Next, the first scattering layer 140 is removed.

Figure 7:
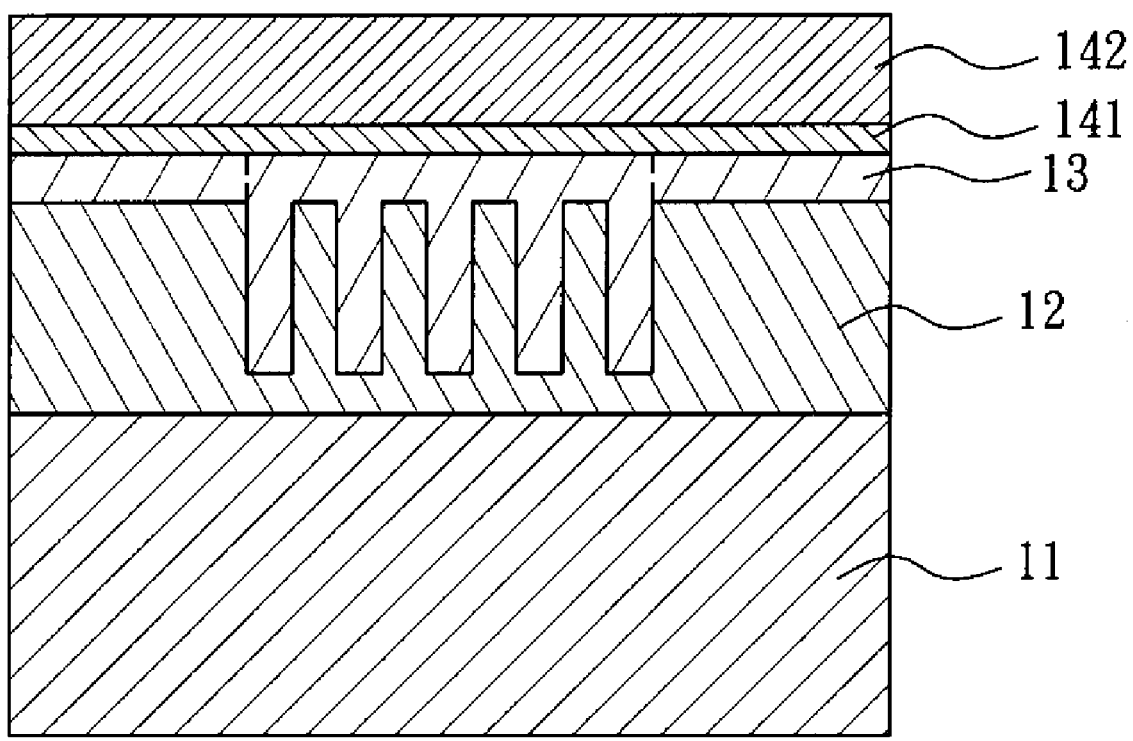
FIGS. 7 and 8 are schematic views of forming a gate group according to the present invention.
Figure 8:
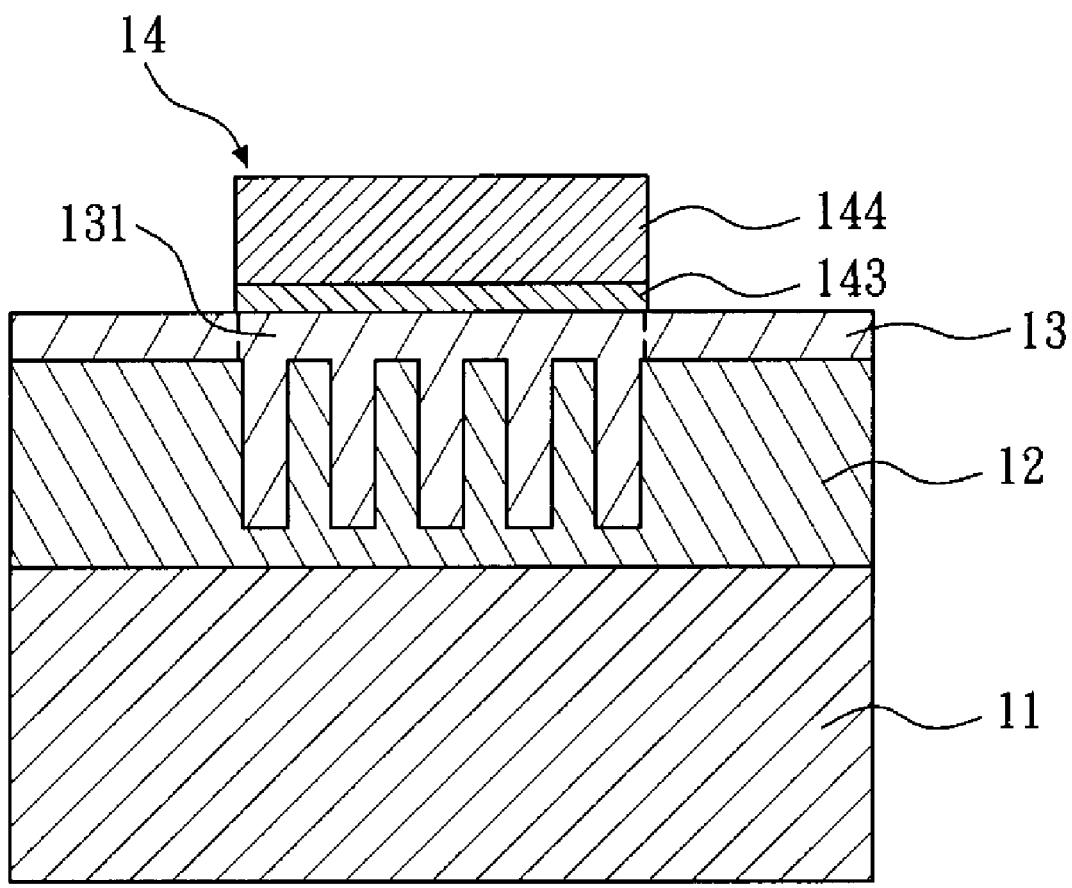

Referring to FIGS. 7 and 8, a dielectric layer 141 is formed, so as to cover the semiconductor conductive layer 13. Next, a gate layer 142 is formed, so as to cover the dielectric layer 141. Next, a part of the dielectric layer 141 and a part of the gate layer 142 are removed, so as to form a gate dielectric layer 143 and a gate 144, thereby forming a gate group 14. The gate dielectric layer 143 covers the first part 131, and the gate 144 covers the gate dielectric layer 143.

In this embodiment, the dielectric layer 141 is formed by using the LPCVD method or a high temperature dry oxidization method, the gate layer 142 is formed by using the LPCVD method, and a part of the dielectric layer 141 and a part of the gate layer 142 are removed by using the optical lithography technique or the e-beam lithography technique.

Figure 9:
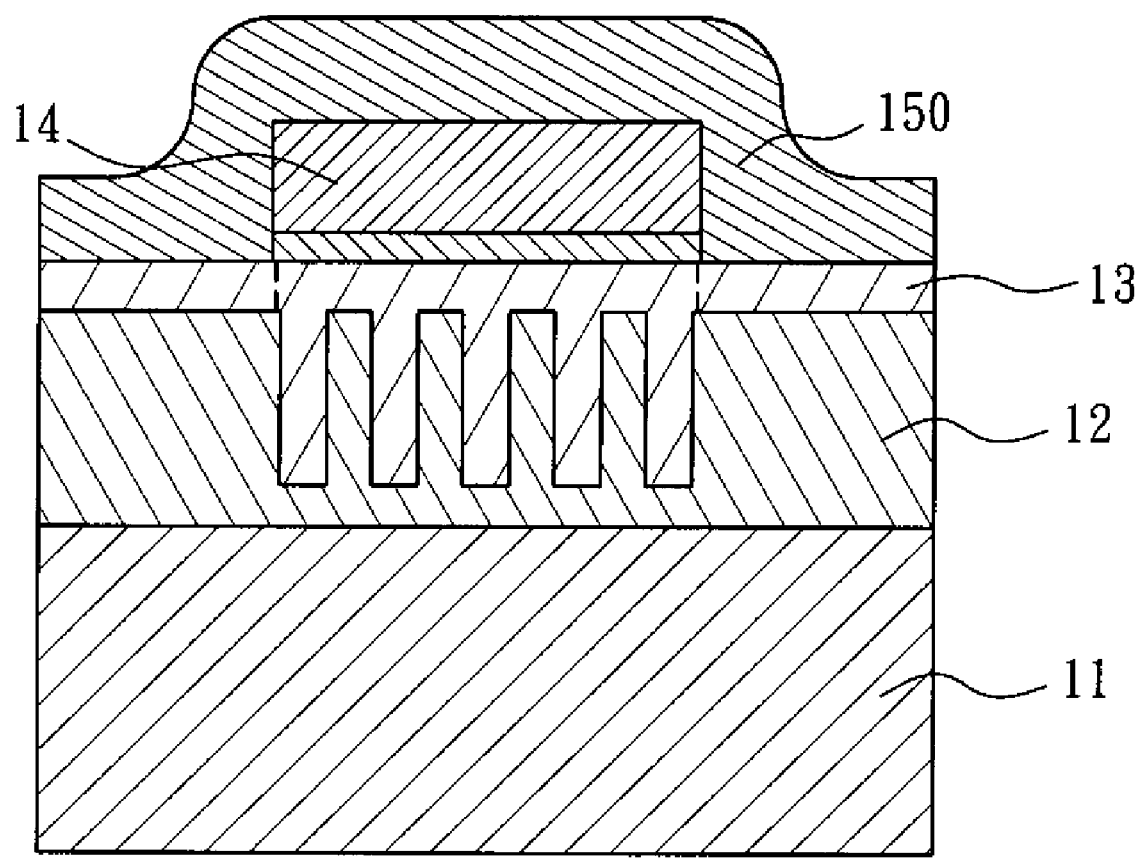
FIG. 9 is a schematic view of forming a silicon compound layer according to the present invention.
Figure 10:
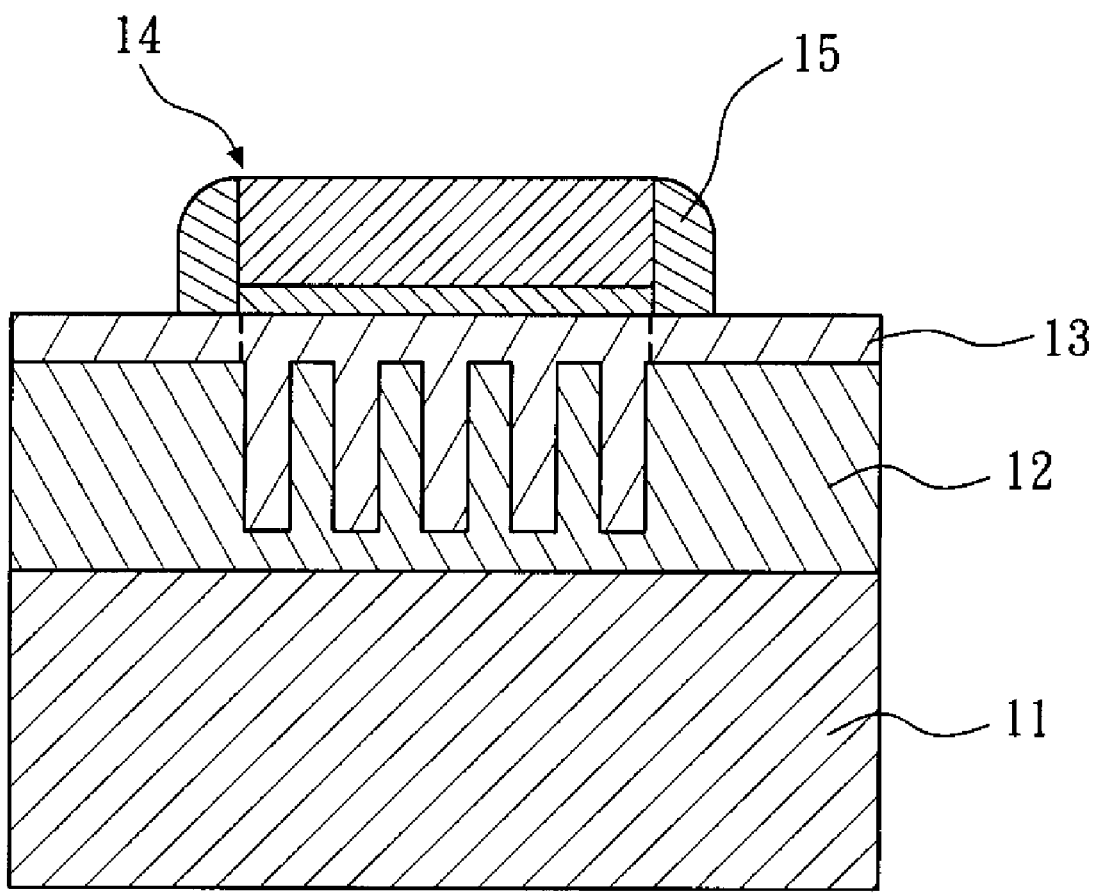
FIG. 10 is a schematic view of forming a spacer according to the present invention.

Referring to FIGS. 9 and 10, a silicon compound layer 150 is formed, so as to cover the semiconductor conductive layer 13 and the gate group 14. Preferably, the silicon compound layer 150 is formed by using the LPCVD method. The silicon compound layer 150 is silicon dioxide or silicon nitride. Next, a part of the silicon compound layer 150 is removed, so as to form a spacer 15 that covers two opposite lateral sides of the gate group 14, and the two opposite lateral sides are approximately parallel to the first direction. In this embodiment, a part of the silicon compound layer 150 is removed by using an etching method.

Figure 11:
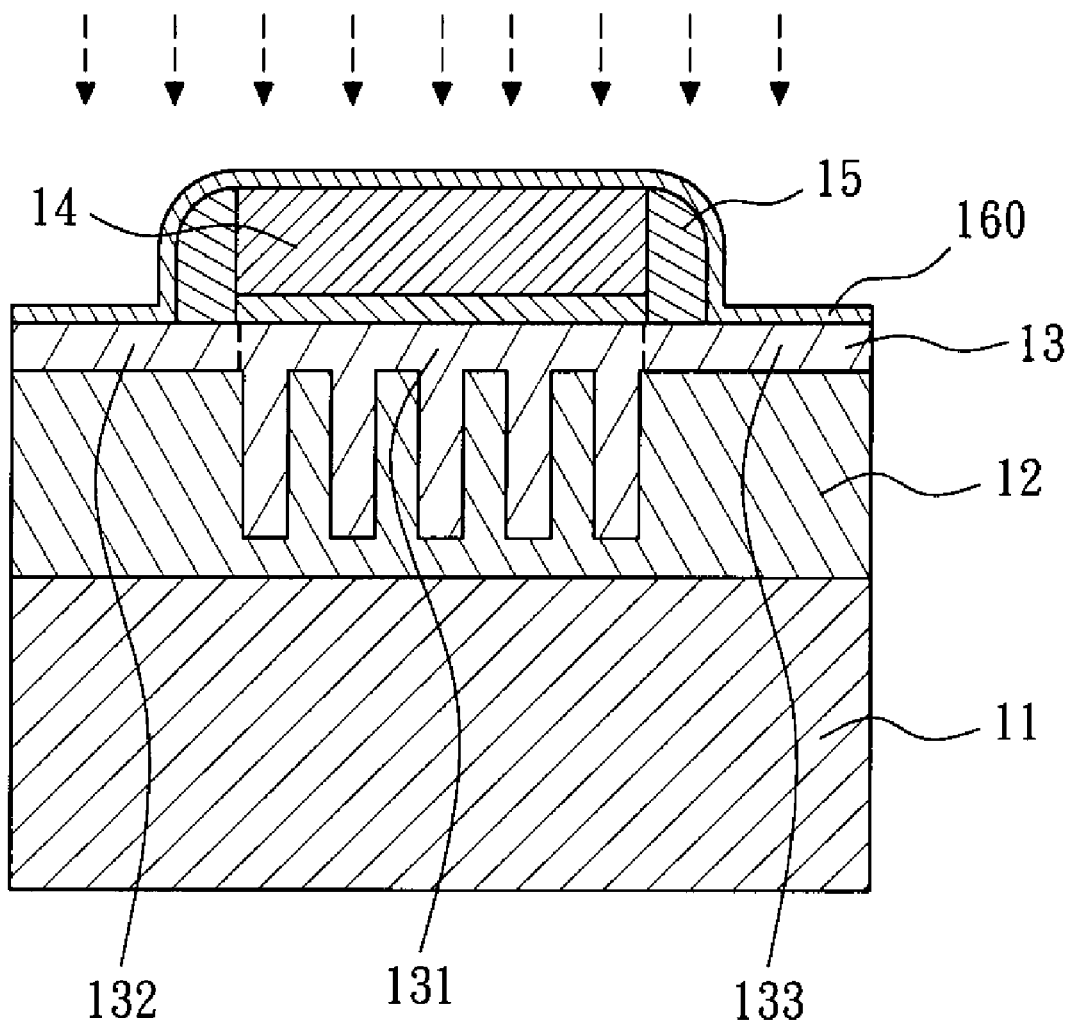
FIGS. 11 and 12 are schematic views of performing an ion implantation step on the semiconductor conductive layer to form a main body, a source, and a drain according to the present invention.
Figure 12:
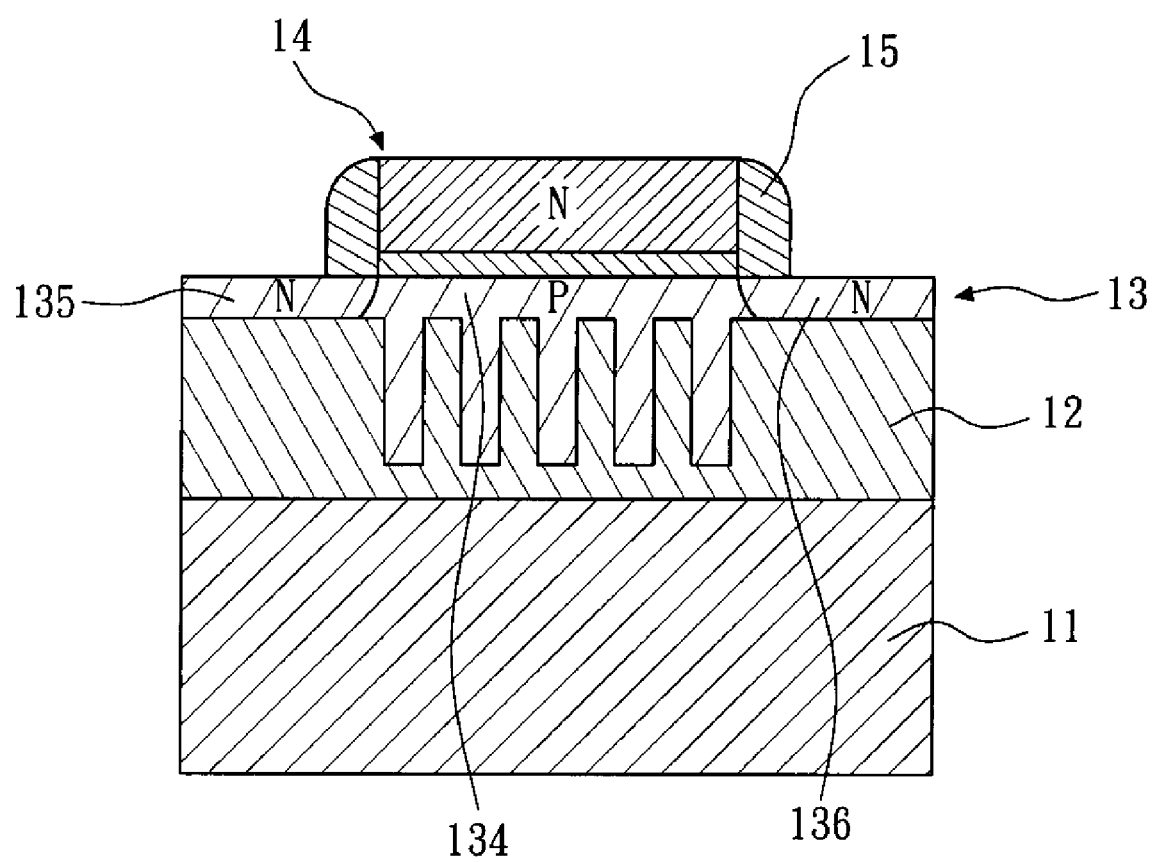

Referring to FIGS. 11 and 12, a second ion implantation step is performed, so as to form a main body 134, a source 135, and a drain 136 corresponding to the first part 131, the second part 132, and the third part 133 of the semiconductor conductive layer 13. Firstly, a second scattering layer 160 is formed, so as to cover the semiconductor conductive layer 13, the spacer 15, and the gate group 14. Next, the second ion implantation step is performed, so as to perform the ion implantation on the first part 131, the second part 132, and the third part 133 of the semiconductor conductive layer 13, thereby forming the main body 134, the source 135, and the drain 136. Finally, the second scattering layer 160 is removed.

In this embodiment, after the second ion implantation step, the method further includes a thermal annealing step, which is performed by using a rapid thermal annealing (RTA) technique or a high temperature furnace anneal.

Figure 13:
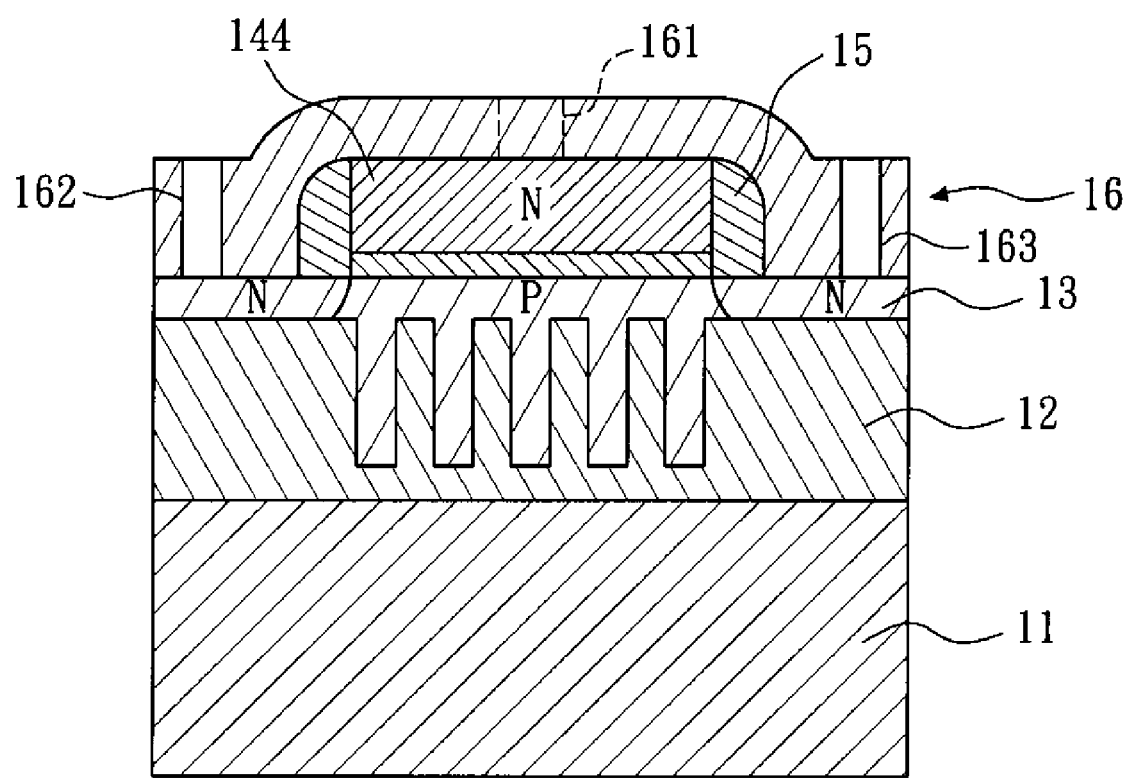
FIG. 13 is a schematic view of forming an oxide protective layer according to the present invention.

Referring to FIG. 13, an oxide protective layer 16 is formed that covers the source 135, the drain 136, the spacer 15, and the gate 144, and has a first through hole 161, a second through hole 162, and a third through hole 163. The first through hole 161, the second through hole 162, and the third through hole 163 are respectively formed at positions above and corresponding to the gate 144, the source 135, and the drain 136, so as to expose a part of the gate 144, a part of the source 135, and a part of the drain 136. In this embodiment, the first through hole 161, and the second through hole 162 and the third through hole 163 are respectively located on two opposite ends above the substrate 11.

In this embodiment, the oxide protective layer 16 is formed through plasma enhanced chemical vapor deposition (PECVD), and the first through hole 161, the second through hole 162, and the third through hole 163 are formed by using the optical lithography technique or the e-beam direct writing technique.

Figure 14:
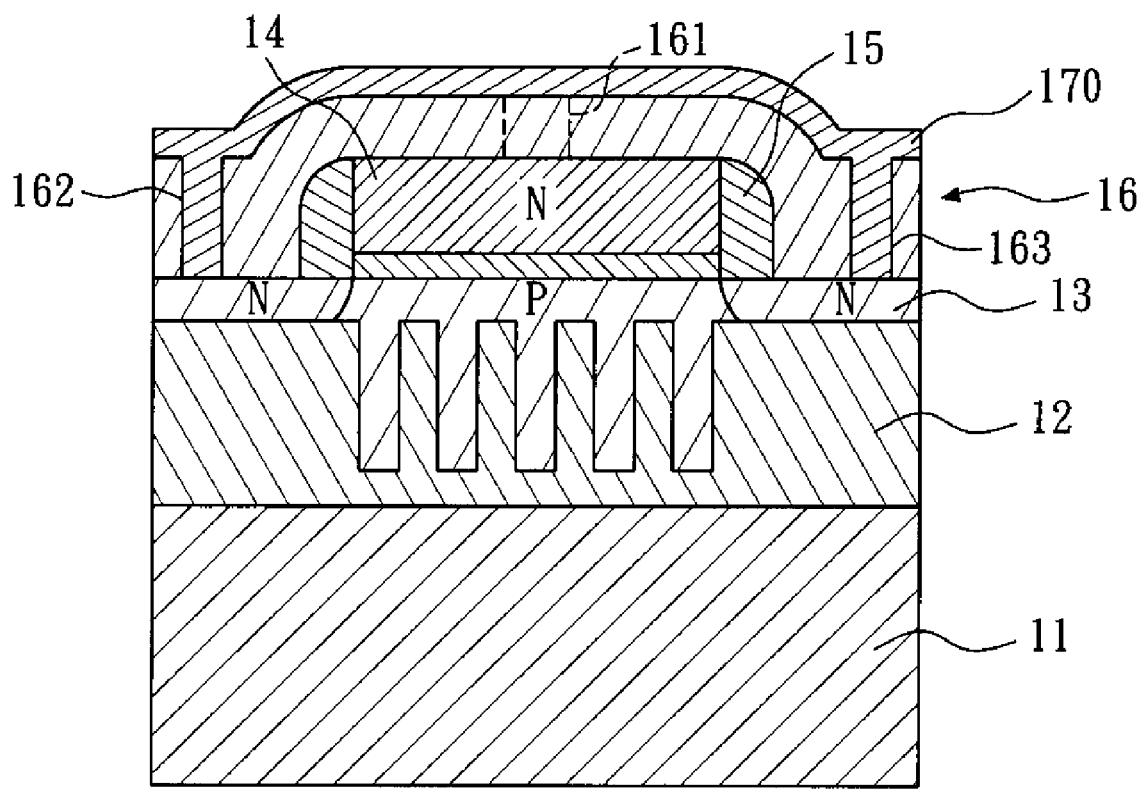
FIG. 14 is a schematic view of forming a metal layer according to the present invention.
Figure 15:
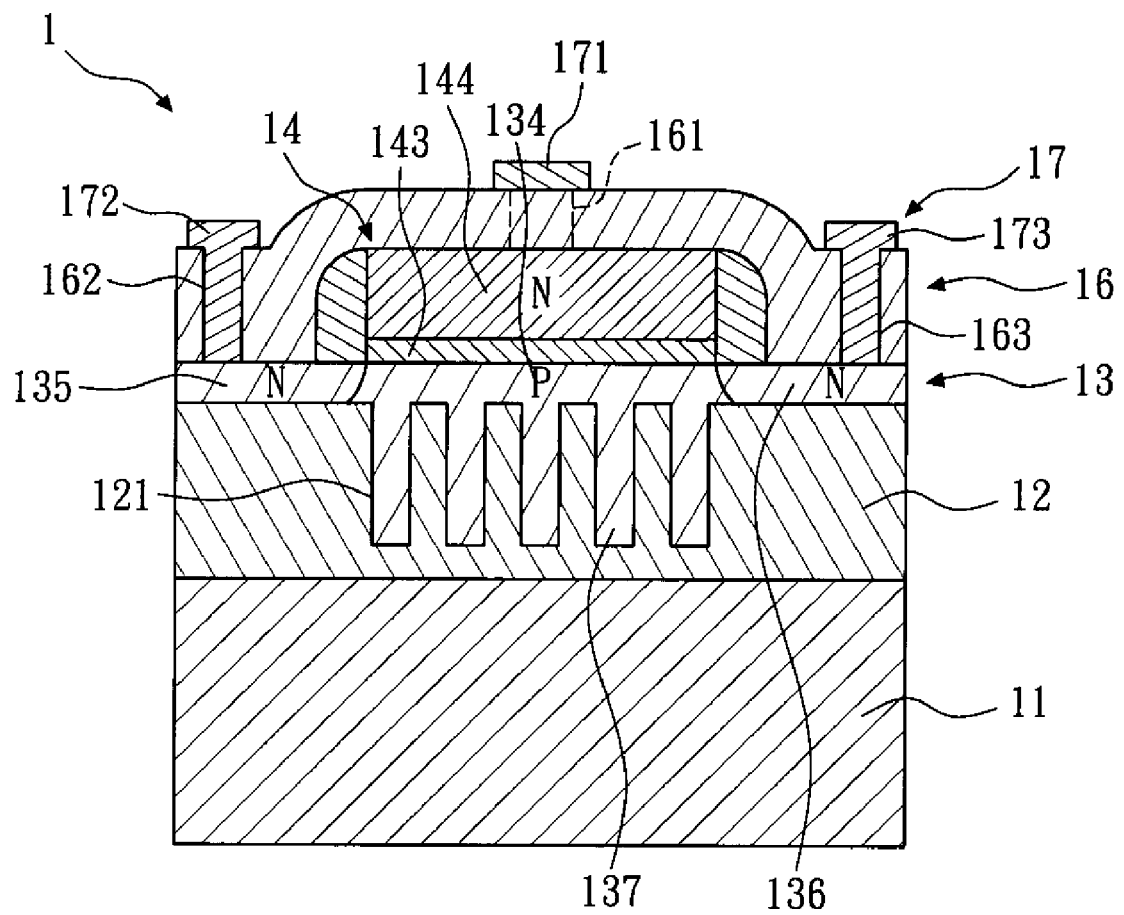
FIG. 15 is a schematic view of a trench SOI-DRAM cell according to the present invention.

Referring to FIGS. 14 and 15, firstly, a metal layer 170 is formed that covers the oxide protective layer 16, the first through hole 161, the second through hole 162, and the third through hole 163. In this embodiment, the metal layer 170 is formed by using a physical vapor deposition (PVD) method. Finally, a part of the metal layer 170 is removed, so as to form an electrode group 17. Thus, the process for making a trench SOI-DRAM cell 1 of the present invention is completed.

The electrode group 17 has a first electrode 171, a second electrode 172, and a third electrode 173, respectively disposed in the first through hole 161, the second through hole 162, and the third through hole 163, and respectively electrically connected to the gate 144, the source 135, and the drain 136. In this embodiment, structures and shapes of the first electrode 171, the second electrode 172, and the third electrode 173 are formed by using the optical lithography technique or the e-beam direct writing technique.

FIG. 15 shows a trench SOI-DRAM cell of the present invention. Referring to FIG. 15, the DRAM cell 1 includes a substrate 11, an oxide layer 12, a semiconductor conductive layer 13, a gate group 14, a spacer 15, an oxide protective layer 16, and an electrode group 17. Preferably, the substrate 11 is a silicon wafer substrate, a glass substrate, a plastic substrate, or a quartz substrate.

The oxide layer 12 covers the substrate 11 and has a plurality of trenches 121, and the trenches 121 extend approximately towards a first direction (in this embodiment, the first direction is perpendicular to the paper surface). The oxide layer 12 is silicon dioxide or other insulators. Preferably, a width of the trenches 121 is from 5 nm to 50 nm, and a depth of the trenches 121 is from 10 nm to 300 nm.

The semiconductor conductive layer 13 covers the oxide layer 12 and the trenches 121, and has a main body 134, a source 135, and a drain 136. The main body 134 covers the trenches 121, so as to form a plurality of semiconductor conductive units 137. The source 135 and the drain 136 are formed on two different sides of the main body 134, and surfaces of the two sides are approximately parallel to the first direction. The semiconductor conductive layer 13 is silicon, polysilicon, or other semiconductors. Corresponding to a top surface of the oxide layer 12, a thickness of the semiconductor conductive layer 13 is from 5 nm to 150 nm. In addition, the semiconductor conductive layer 13 may be an N-type semiconductor or a P-type semiconductor.

The gate group 14 has a gate dielectric layer 143 and a gate 144. The gate dielectric layer 143 covers the main body 134, and the gate 144 covers the gate dielectric layer 143. Preferably, a material of the gate dielectric layer 143 is selected from silicon dioxide ($SiO_2$), tantalum oxide ($Ta_2O_5$), titanium oxide ($TiO_2$), or a dielectric material having an equivalent thickness from 0.5 nm to 50 nm and a set high dielectric constant higher than 10. In this embodiment, a thickness of the gate 144 is from 30 nm to 250 nm, and the gate 144 is the N-type semiconductor, and in other applications, the gate 144 may be the P-type semiconductor. Preferably, the gate 144 is a polysilicon layer, which is a mid-gap metal or metal silicide with single layer or multi-layer growth.

The spacer 15 covers two opposite lateral sides of the gate group 14, and the two opposite lateral sides are approximately parallel to the first direction. Preferably, the spacer 15 is silicon dioxide or silicon nitride.

The oxide protective layer 16 covers the source 135, the drain 136, the spacer 15, and the gate 144, and has a first through hole 161, a second through hole 162, and a third through hole 163. The first through hole 161, 15 the second through hole 162, and the third through hole 163 are respectively formed at positions above and corresponding to the gate 144, the source 135, and the drain 136, so as to expose a part of the gate 144, a part of the source 135, and a part of the drain 136. Preferably, the oxide protective layer 16 is $SiO_2$, phosphosilicate glass (PSG), borophosphosilicate glass (BPSG), fluorinated silicate glass (FSG), diamond, or other materials with a low dielectric constant.

The electrode group 17 has a first electrode 171, a second electrode 172, and a third electrode 173, respectively disposed in the first through hole 161, the second through hole 162, and the third through hole 163, and respectively electrically connected to the gate 144, the source 135, and the drain 136. Preferably, the electrode group 17 is aluminum (Al), copper (Cu), or an aluminum-silicon-copper (Al—Si—Cu) alloy.

Figure 16:
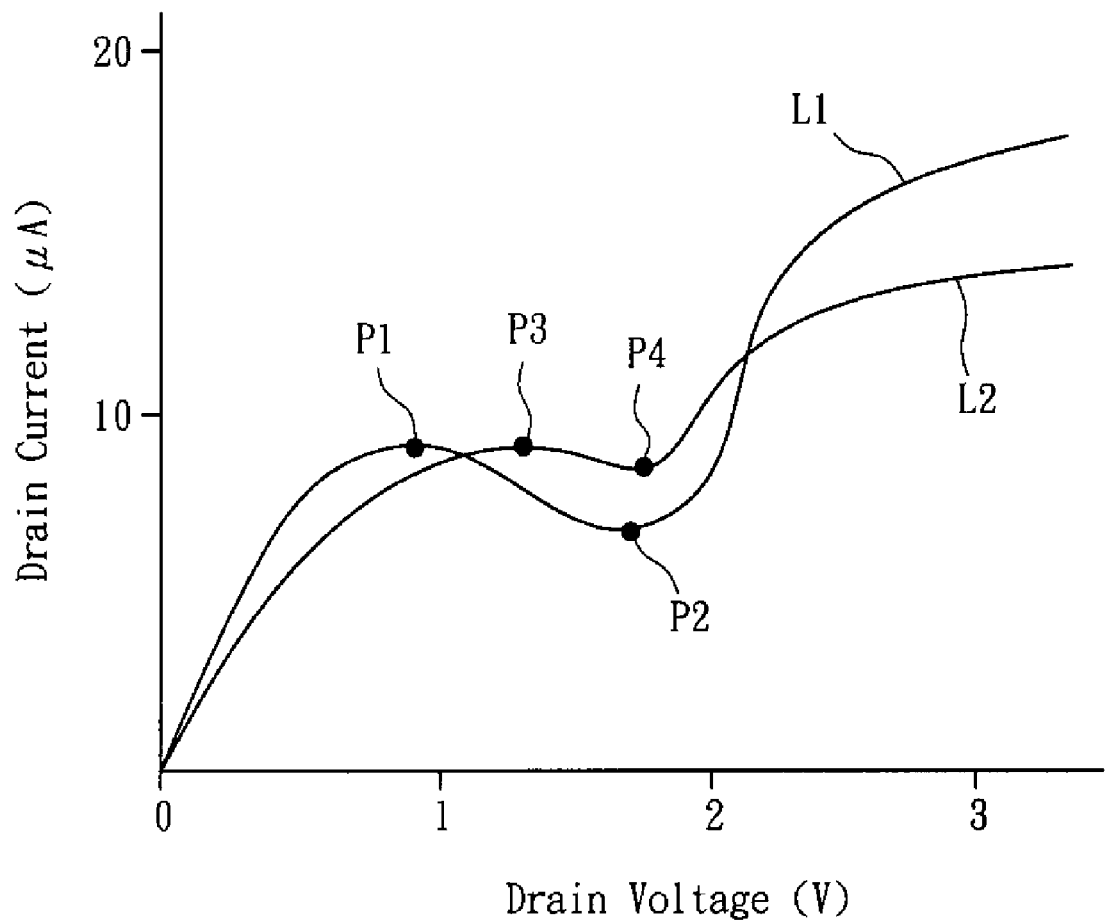
FIG. 16 is a curve diagram of a kink effect of the trench SOI-DRAM cell according to the present invention and a conventional SOI transistor device.

FIG. 16 is a curve diagram of a kink effect of the trench SOI-DRAM cell 1 according to the present invention and a conventional SOI transistor device. In FIG. 16, L1 represents a curve of the trench SOI-DRAM cell 1 according to the present invention, and L2 represents a curve of the conventional SOI transistor device.

A point P1 on the curve L1 and a point P3 on the curve L2 represent the fact that when a data state is "1" (write), a saturated drain voltage is applied, so that a reverse bias is generated on a P-N junction between the main body and the drain, and excessive carriers are stored in the trench because of a thermion impact effect of the junction. A point P2 on the curve L1 and a point P4 on the curve L2 represent the fact that when the data state is "0" (erase), a small negative source voltage is applied, so that a forward bias is generated on the P-N junction between the main body and the drain, so as to eliminate the electric charges stored in the trench.

By reason of the floating body effect, the number of the electric charges in the trench is changed, and a potential difference generated by the stored electric charges will affect the gate critical voltage characteristics and the kink effect caused by an output current.

In addition, when the data state is read, two observing modes are used; one is to provide sub-threshold characteristics operating in a linear region, and observe shift changes of the threshold voltage, and the other is to provide the output current characteristics, and observe the degree of the output current affected by the kink effect, in which the current change is to judge the read data.

It is known from FIG. 16 that the kink effect of the trench SOI-DRAM cell 1 according to the present invention is greater than that of the conventional SOI transistor device, so the integration density is higher, which helps to read the data.

Referring to FIG. 15, the source 135 and the drain 136 of the present invention are each connected to one of two semiconductor conductive units 137 on the external side of the main body 134, and the plurality of other semiconductor conductive units 137 exists between the two semiconductor conductive units 137 on the external side of the main body 134, so the semiconductor conductive units 137 may directly accumulate the electric charges generated from the drain 136, and the potentials generated by the accumulated electric charges may reduce the threshold voltage of the DRAM cell 1 of the present invention.

In addition, the DRAM cell 1 of the present invention only uses one FET device (1T), has the conventional 1T-DRAM characteristics, and has an integration density higher than that of the conventional memory. Moreover, the process for making the DRAM cell 1 of the present invention is simple, so the production cost can be greatly reduced.

While the embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A trench silicon-on-insulator (SOI) dynamic random access memory (DRAM) cell, comprising:
    a substrate;
    an oxide layer, covering the substrate, and having a plurality of trenches those extend approximately towards a first direction;
    a semiconductor conductive layer, covering the oxide layer and the trenches, having a main body, a source, and a drain, wherein the main body covers the trenches to form a plurality of semiconductor conductive units, the source and the drain are formed on two different sides of the main body, and surfaces of the two sides are approximately parallel to the first direction;
    a gate group, having a gate dielectric layer and a gate, wherein the gate dielectric layer covers the main body, and the gate covers the gate dielectric layer;
    a spacer, covering two opposite lateral sides of the gate group those are approximately parallel to the first direction;
    an oxide protective layer, covering the source, the drain, the spacer, and the gate, and having a first through hole, a second through hole, and a third through hole that are respectively formed at positions above and corresponding to the gate, the source, and the drain, so as to expose a part of the gate, a part of the source, and a part of the drain; and
    an electrode group, having a first electrode, a second electrode, and a third electrode, respectively disposed in the first through hole, the second through hole, and the third through hole, and respectively electrically connected to the gate, the source, and the drain.

2. The DRAM cell according to claim 1, wherein the substrate is a silicon wafer substrate, a glass substrate, a plastic substrate, or a quartz substrate.

3. The DRAM cell according to claim 1, wherein the oxide layer is silicon dioxide or other insulators.

4. The DRAM cell according to claim 1, wherein a width of the trench is from 5 nm to 50 nm, and a depth of the trench is from 10 nm to 300 nm.

5. The DRAM cell according to claim 1, wherein the semiconductor conductive layer is silicon, polysilicon, or other semiconductors.

6. The DRAM cell according to claim 1, wherein corresponding to a top surface of the oxide layer, a thickness of the semiconductor conductive layer is from 5 nm to 150 nm.

7. The DRAM cell according to claim 1, wherein the semiconductor conductive layer is an N-type semiconductor.

8. The DRAM cell according to claim 1, wherein the semiconductor conductive layer is a P-type semiconductor.

9. The DRAM cell according to claim 1, wherein a thickness of the gate is from 30 nm to 250 nm.

10. The DRAM cell according to claim 1, wherein a material of the gate dielectric layer is selected from silicon dioxide ($SiO_2$), tantalum oxide ($Ta_2O_5$), titanium oxide ($TiO_2$), or a dielectric material having an equivalent thickness from 0.5 nm to 50 nm and a set high dielectric constant.

11. The DRAM cell according to claim 10, wherein the set high dielectric constant value is greater than 10.

12. The DRAM cell according to claim 1, wherein the gate is an N-type semiconductor.

13. The DRAM cell according to claim 1, wherein the gate is a P-type semiconductor.

14. The DRAM cell according to claim 1, wherein the gate is a polysilicon layer.

15. The DRAM cell according to claim 14, wherein the polysilicon layer is a mid-gap metal or metal silicide with single layer or multi-layer growth.

16. The DRAM cell according to claim 1, wherein the spacer is silicon dioxide or silicon nitride.

17. The DRAM cell according to claim 1, wherein the oxide protective layer is silicon dioxide, phosphosilicate glass (PSG), borophosphosilicate glass (BPSG), fluorinated silicate glass (FSG), diamond, or other low dielectric constant materials.

18. The DRAM cell according to claim 1, wherein the electrode group is aluminum (Al), copper (Cu), or an aluminum-silicon-copper (Al—Si—Cu) alloy.

* * * * *